United States Patent [19]

Asaba

[11] Patent Number: 5,534,453
[45] Date of Patent: Jul. 9, 1996

[54] METHOD OF MANUFACTURING TITANIUM SILICIDE CONTAINING SEMICONDUCTORS

[75] Inventor: Tetsuo Asaba, Odawara, Japan

[73] Assignee: Canon Kabushiki Kaisha, Tokyo, Japan

[21] Appl. No.: 160,141

[22] Filed: Dec. 2, 1993

[30] Foreign Application Priority Data

Dec. 4, 1992 [JP] Japan .................................. 4-350207

[51] Int. Cl.$^6$ ............................ H01L 21/44; H01L 21/28
[52] U.S. Cl. ................................ 437/41; 437/200; 437/40
[58] Field of Search ............................ 437/141, 192, 437/200, 41 GS, 40 GS; 148/DIG. 15, DIG. 17, DIG. 147; 156/655.1

[56] References Cited

U.S. PATENT DOCUMENTS

| 4,777,150 | 10/1988 | Deneuville et al. | 437/200 |
| 4,814,294 | 3/1989 | West et al. | 437/200 |
| 4,873,204 | 10/1989 | Wong et al. | 437/200 |
| 5,124,280 | 6/1992 | Wei et al. | 437/193 |
| 5,173,450 | 12/1992 | Wei | 437/200 |

FOREIGN PATENT DOCUMENTS

| 0068843 | 1/1983 | European Pat. Off. . |
| 0435392 | 7/1991 | European Pat. Off. . |

OTHER PUBLICATIONS

S. W. Kang et al "Effects of amorphous silicon capping layer on arsenic redistribution during $TiSi_2$ formation" Appl Phys Lett 54(8) 20 Feb. 1989 pp 693–695.

S. W. Kang, "The Effect of Amorphous Silicon Capping on Titanium During TiSi2 Formation by RTA", J. Materials Science, vol. 25, No. 1A, Jan. 1990, pp. 98–102.

Patent Abstracts of Japan, vol. 15, No. 390, Oct. 3, 1991 JPA A-03155 641.

Primary Examiner—George Fourson
Assistant Examiner—C. Everhart
Attorney, Agent, or Firm—Fitzpatrick, Cella, Harper & Scinto

[57] ABSTRACT

A method of manufacturing a semiconductor device having a titanium silicide layer comprises the steps of forming a silicon layer and titanium layer on a polysilicon layer, washing a surface of the silicon layer, and heat treating the titanium layer after washing to make the titanium layer a titanium silicide.

5 Claims, 4 Drawing Sheets

METHOD OF MANUFACTURING TITANIUM SILICIDE CONTAINING SEMICONDUCTORS

BACKGROUND OF THE INVENTION

1. Field of the Invention

The present invention relates to a method of manufacturing semiconductor devices having a titanium silicide, and more particularly, to a method of forming a polycide structure of which a component thereof is a titanium silicide.

2. Description of the Related Art

Advances in the miniaturization of semiconductor devices have been made every year, so that MOS transistors in which a gate length is, for example, 1 µm or less are available on the market. However, the resulting increase in the IC complexity causes media delay of the gate employing polysilicon, and thus there has been a demand for a gate material having a low resistivity.

To meet this demand, a gate electrode having a polycide structure, in which a tungsten silicide or a molybdenum silicide is disposed in an upper portion thereof while a polysilicon is disposed in a lower portion thereof, has been developed. The sheet resistance of the polysilicon is 20 Ω/□, the sheet resistance of molybdenum polycide is 5 Ω/□, and the sheet resistance of tungsten polycide is 2 Ω/□.

Among the above-described gate materials, polysilicon was put into practical use for the first time. Molybdenum polycide followed it, which was followed by tungsten polycide. So far, the practical use of a gate material having a lower resistivity than tungsten polycide has not been realized.

Under the above-described circumstances, titanium polycide is known as a material having a lower resistance than tungsten polycide. Titanium polycide can offer a sheet resistance of 0.5 Ω/□ through 1.0 Ω/□, which is the lowest resistance ever offered by gate materials having a polycide structure. Conventionally, titanium polycide is formed by a method called the alloying method. FIG. 5 illustrates the concept of this alloying method.

First, a polysilicon 203 and a pure metal titanium 204 are deposited on an insulating film 202 of, for example, silicon dioxide. Low pressure CVD is generally used as the deposition method for the polysilicon 203, and the pure metal titanium 204 is generally formed by sputtering (FIG. 5(a)).

Next, heat treatment is conducted at about 800° C. in a gas which is inactive to the pure metal titanium, such as a forming gas, to cause the silicide formation reaction of the upper titanium 204 and the lower silicon 203 to take place. This results in formation of a titanium silicide 205 on top of the silicon 203 (FIG. 5(b)).

The titanium polycide formed in the above-described manufacturing method exhibits a very low resistance. However, application of such a titanium polycide to the manufacturing process of semiconductor devices has following two crucial drawbacks.

The first drawback is that hydrofluoric acid cannot be used to wash the titanium prior to the heat treatment required for silicide formation because titanium is soluble in hydrofluoric acid, and will be dissolved instantaneously. Since the heat treatment required for forming silicide is conducted at a relatively high temperature of about 800° C., if washing with hydrofluoric acid is impossible, the impurities attached to the surface of the wafer diffuse into the semiconductor substrate, thus increasing the possibility of device breakdown. This is the primary reason why the polycide having the titanium silicide on the top thereof is not put into practical use.

The second drawback is that an inactive gas, such as a forming gas, must be used in the heat treatment to form the silicide. This is because titanium is a very active element, which can be oxidized in the presence of a very small amount of oxygen or can be nitridized in the presence of nitrogen. Accordingly, a forming gas is generally used. However, a forming gas is very expensive as compared with nitrogen, thus increasing production cost. This is the second drawback of the alloying method.

SUMMARY OF THE INVENTION

An object of the present invention is to provide a method of manufacturing a semiconductor device which enables the reliability of the semiconductor device to be enhanced by performing heat treatment after the impurities attached to the surface of the semiconductor device have been removed by washing, and which enables production cost to be reduced by conducting heat treatment employing inexpensive nitrogen gas.

DESCRIPTION OF THE INVENTION AND PREFERRED EMBODIMENTS OF THE INVENTION

To achieve the above-described objects, the present invention provides a method of manufacturing a semiconductor device having a titanium silicide layer, which comprises the steps of forming a silicon layer on a titanium layer, washing a surface of the silicon layer, and heat treating the titanium layer after the step of washing to make the titanium layer a titanium silicide.

The present invention also includes the following features.

Washing the washing is performed using hydrofluoric acid.

The heat treatment is conducted using nitrogen gas.

The heat treatment is conducted at 700° C. or above.

The titanium layer is sandwiched by a lower silicon layer and the upper silicon layer and is made the titanium silicide from both above and below the titanium layer by the heat treatment.

In the present invention, since the silicon is deposited, by, for example, sputtering, on the titanium deposited on the polysilicon to cover the surface of the titanium prior to the heat treatment, unlike the conventional alloying method, the surface washing with hydrofluoric acid is enabled. Further, since the reaction of the metal titanium with the atmosphere can be prevented, the heat treatment can be performed using an inexpensive nitrogen gas or the like without using an expensive inactive gas, such as a forming gas.

Further, since the titanium layer is sandwiched by the upper silicon layer and a lower silicon layer, the silicide forming reaction can proceed from above and below the titanium during the heat treatment. This enables a more uniform titanium silicide layer to be obtained in a short period of time.

[First Embodiment]

Figure 1A:
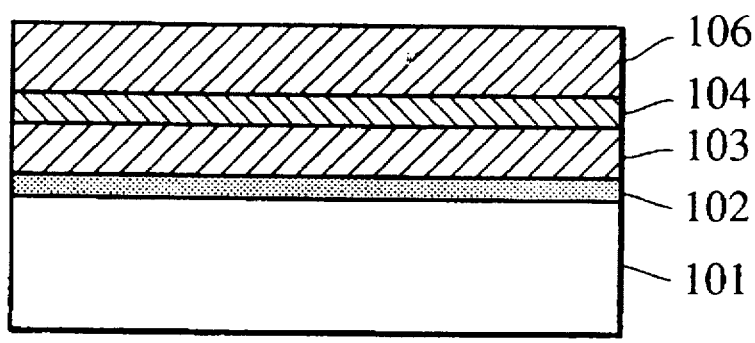
FIG. 1(a) and 1(b) are schematic views illustrating a manufacturing method according to the present invention.
Figure 1B:
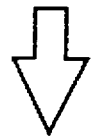
Figure 1B:
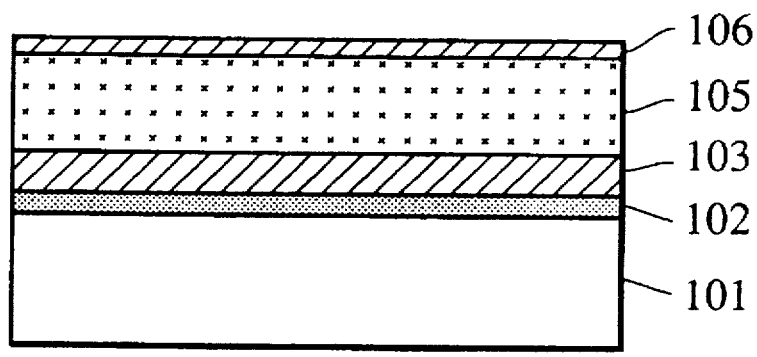

FIGS. 1(a) and 1(b), are an illustration of the feature of the present invention. In FIGS. 1(a) and 1(b), reference numeral 101 denotes a semiconductor substrate; reference numeral 102 denotes an insulating film of, for example, silicon dioxide; reference numeral 103 denotes a polysilicon; reference numeral 104 denotes a pure metal titanium; reference numeral 105 denotes a titanium silicide formed after the heat treatment; and reference numeral 106 denotes a silicon deposited by, for example, sputtering. FIG. 1(a) illustrates the state obtained before the heat treatment in which the silicon, the titanium and the silicon have just been deposited in that order. FIG. 1(b) illustrates the state obtained after the heat treatment in which the polysilicon 103 and the silicon film 106 have reacted with the titanium 104 and thus thinned, extinguishing the titanium 104. The silicide forming reaction forms the titanium silicide 105 between the polysilicon 103 and the silicon film 106.

The method of manufacturing the semiconductor device according to the first embodiment of the present invention will now be described with reference to FIGS. 2(a) through 2(g).

Figure 2A:
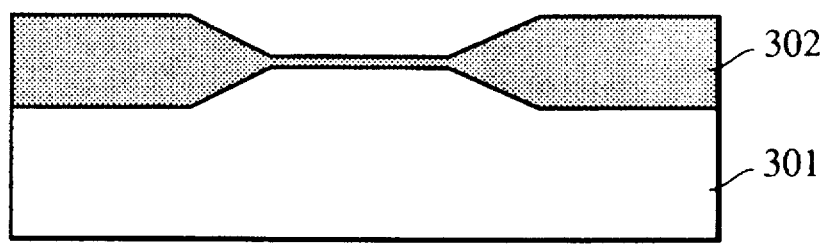
FIGS. 2(a), 2(b), 2(c), 2(d), 2(e), 2(f) and 2(g) are schematic views illustrating the manufacturing process of a MOS transistor to which the present invention is applied.

First, a thermal oxide film 302 is formed on the surface of a silicon substrate 301 to a thickness of 8000 Å at a field area and to a thickness of 300 Å at a device area. In this embodiment, the substrate 301 is of the P type because the manufactured transistor is an N channel type MOS transistor. If it is desired to manufacture a P channel type MOS transistor, an n type substrate is used. Boron has been implanted below the 8000 Å-thick field oxide film 302 at a rate of $4 \times 10^{13}$ dose/cm$^2$ as a channel stop, as shown in FIG. 2(a).

Figure 2B:
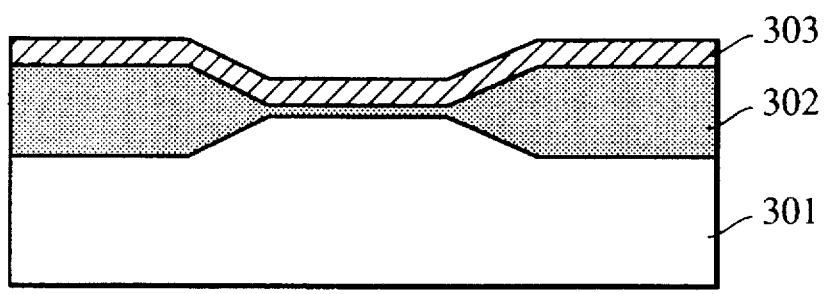
Figure 2C:
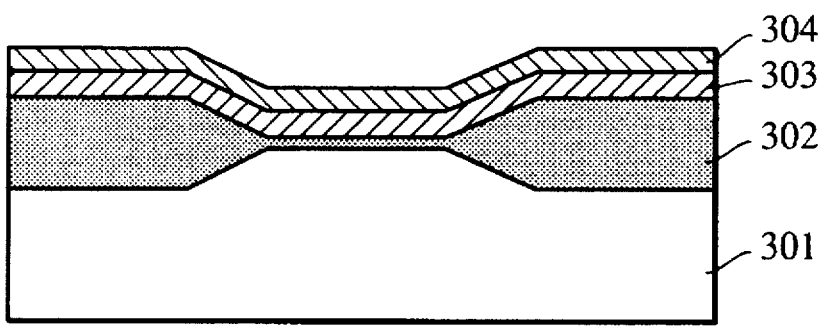

Next, polysilicon is deposited to a thickness of 2500 Å by the low pressure CVD, as shown in FIG. 2(b). $SiH_4$ is used as the gas, and the deposition temperature is 620° C. (FIG. 2(b)).

Thereafter, the silicon substrate, which is in a state shown in FIG. 2(b), is placed in a sputtering device in which chambers are connected through vacuum tanks, as shown in FIG. 4. First, a gate valve 408 is opened, and then the substrate is placed in a load lock chamber 401. Thereafter, the load lock chamber is evacuated, a gate valve 409 is opened, and then the substrate is conveyed into a conveying chamber 402.

Next, a gate valve 410 is opened, the wafer is conveyed into a first sputtering chamber 403, and then the gate valve 410 is closed. In the first sputtering chamber 403, a pure metal titanium target has been disposed such that it opposes the substrate. In that state, titanium is sputtered at a substrate temperature of 200° C. using argon as the gas. Argon is supplied at a rate of 25 SCCM. A D.C. power supplied to the electrodes is 1 kW. About 1000 Å-thick titanium 304 is deposited by performing sputtering for 1 minute and 8 seconds (FIG. 2(c)).

Next, the gate valve 410 of the device shown in FIG. 4 is opened, and the substrate is returned to the conveying chamber 402. Next, the gate valve 410 is closed, a gate valve 411 is opened, the substrate is conveyed into a second sputtering chamber 404, and then the gate valve 411 is closed. In the second sputtering chamber 404, a silicon target has been disposed such that it opposes the substrate. In that state, sputtering of silicon is conducted using argon as the gas. Argon is supplied at a rate of 30 SCCM, and the substrate temperature is 150° C. An RF power applied to the electrodes is 1 kW. In this embodiment, RF sputtering is conducted. However, DC sputtering may also be conducted if boron or phosphorus is doped in the silicon target. A 1500 Å-thick silicon 306 is deposited by conducting sputtering for 3 minutes and 30 seconds (FIG. 2(d)).

Thereafter, the gate valve 411 of the device shown in FIG. 4 is opened, and the substrate is returned to the conveying chamber 402. After the gate valve 411 is closed, the gate valve 409 is opened, and the substrate is returned to the load lock chamber 401. Subsequently, the gate valve 409 is closed, and the pressure of the load lock chamber 401 is returned to the atmospheric pressure. After the gate valve 408 is opened, the substrate is moved out from the load lock chamber 401. Since the substrate is in a vacuum from the state shown in FIG. 2(b) through the state shown in FIG. 2(d), there is no chance of the titanium layer 304 being exposed to the atmosphere.

Figure 2D:
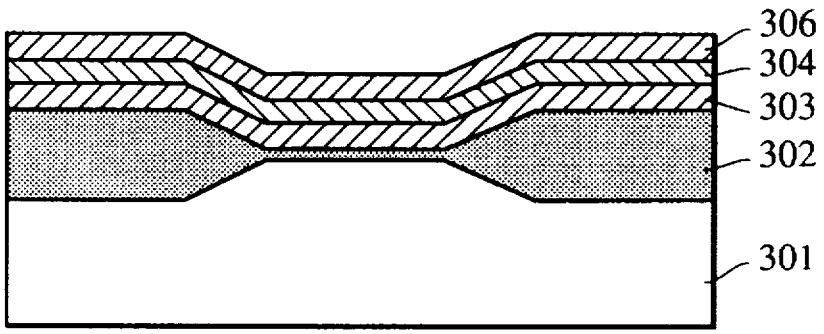
Figure 2E:
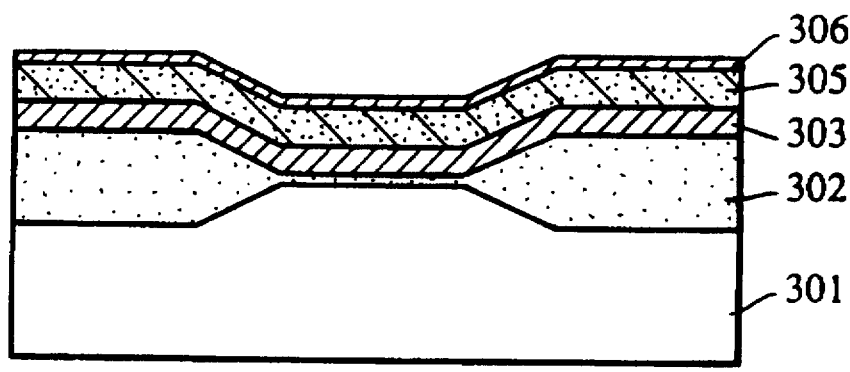
Figure 2F:
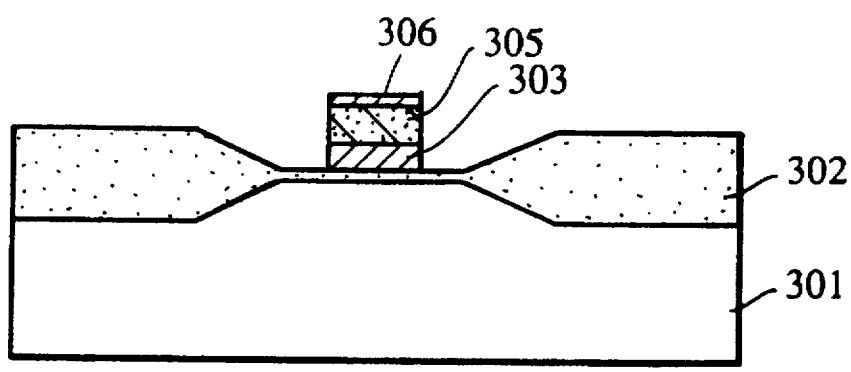
Figure 2G:
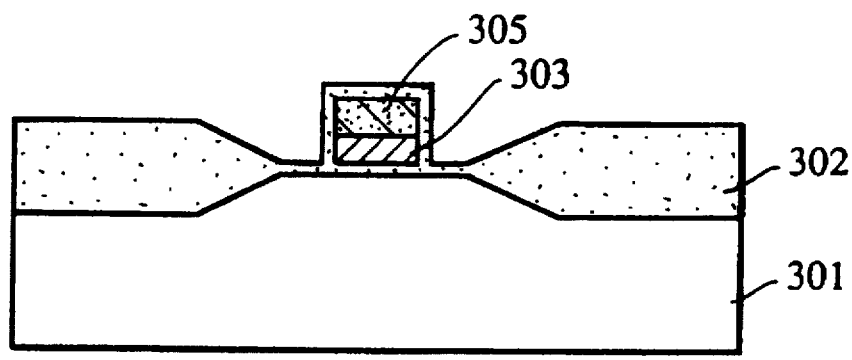

The substrate, which is in a state shown in FIG. 2(d), is washed for 40 seconds in a solution which contains 2.5% of hydrofluoric acid, and then heat treated in nitrogen atmosphere. The heat treatment temperature is 800° C. and the treatment lasts 30 minutes. This heat treatment progresses the silicide forming reaction of titanium, extinguishing the titanium layer 304 and forming a 2000 Å-thick titanium silicide layer 305 between the polysilicon 303 and the silicon 306 (FIG. 2(c)). If the temperature of the heat treatment is 700° C. or below, TiSi is produced in place of $TiSi_2$, thus increasing the resistance of the titanium silicide layer. Hydrofluoric acid washing conducted before the heat treatment employs a 2.5% hydrofluoric acid solution in this embodiment. The present inventors have confirmed that the surface of the semiconductor device is not dissolved in a solution which contains up to 10% of hydrofluoric acid. A normal reaction furnace can be used for the heat treatment, even when the treatment is conducted in a nitrogen atmosphere, that is, a special alteration of the furnace, which would be generally required in order to prevent oxidation, is not necessary.

Next, the deposited films are etched in a predetermined form of the gate electrode by photolithography. Etching is of the $Cl_2+SF_6$ type, the pressure is 6 pa, and an RF power of 40 W is applied. A reactive ion etching device is used as the dry etching device. Etching is conducted simultaneously on the sputtered silicon remaining film 306, the titanium silicide 305 and the polysilicon 303, but not conducted on the gate oxide film and the field oxide film 302 (FIG. 2(f)).

Next, the surface of the gate electrode is covered with a heat oxide film. A $SiO_2$ film is formed by the normal dry oxidation process. More specifically, a simple thermal oxidation reaction takes place on the upper surface of the gate electrode which is the sputtered silicon remaining layer 306, and $SiO_2$ is thereby formed. Silicon is supplied from the lower polysilicon layer 303 to the side surface of the titanium silicide layer 305, and $SiO_2$ is thereby formed. A simple thermal oxidation reaction takes place on the side surface of the lower polysilicon layer 303, and $SiO_2$ is thereby formed. After all, the entire outer periphery of the gate electrode is covered with a silicon thermal oxide film (FIG. 2(g)).

In washing conducted prior to the thermal oxidation process, although the side surface of the titanium silicide layer is slightly dissolved, since the etching rate of the 2.5% hydrofluoric acid solution is about 150 Å/min, no serious problem occurs in the manufacturing process, as in the gas of $SiO_2$.

The above-described processes shown in FIGS. 2(b) through 2(g) are those characteristic to the present invention.

Thereafter, a field-effect type transistor is fabricated using the known techniques including the ion implantation process. The polycide structure in which the titanium silicide layer 305 is combined on top of the polysilicon layer 303 offers a sheet resistance of 0.7 $\Omega/\square$, which is about one thirtieth of the sheet resistance, 20 $\Omega/\square$, of a polysilicon and about from one fifth to one third of the sheet resistance, 2 through 5 $\Omega/\square$, of a tungsten polycide.

[Second Embodiment]

Whereas the present invention is applied to the gate electrode of a field-effect type transistor in the above-described embodiment, it can also be applied to a simple interconnection. Application of the present invention to a bit line for a memory is particularly effective.

[Third Embodiment]

The present invention can also be applied to an emitter or a base electrode of a bipolar transistor or to a lead thereof.

In the cases of the second and third embodiments, deposition of the polysilicon below the titanium silicide is unnecessary. That is, at the contact portion of the substrate, after titanium is deposited directly on the substrate, silicon is sputtered on titanium.

As will be understood from the foregoing description, since the surface of the titanium is covered with silicon before the heat treatment is conducted, surface washing with hydrofluoric acid is made possible. Consequently, the quality of the device which has been subjected to the heat treatment is improved.

Further, since reaction of the metal titanium with the atmosphere can be prevented, the use of an expensive inactive gas, such as a forming gas, is unnecessary, and the heat treatment can thus be conducted using, for example, an inexpensive nitrogen gas, reducing production cost.

Further, since the titanium layer is sandwiched by the silicon layers, the silicide formation reaction, which takes place in the titanium during the heat treatment, proceeds in the upward and downward directions. This enables a more uniform titanium silicide layer to be obtained in a short period of time.

What is claimed is:

1. A method of manufacturing a field effect transistor having a titanium silicide layer, said method comprising the steps of:

a) forming a polysilicon layer on an insulating layer;

b) forming a titanium layer on the polysilicon layer;

c) forming a silicon layer on the titanium layer to cover the whole titanium layer;

d) washing a surface of said silicon layer;

e) heat treating said titanium layer which is not exposed after said step of washing to make said titanium layer a titanium silicide layer, wherein said titanium silicide layer is laminated to said polysilicon layer;

f) etching the silicon layer, titanium silicide layer and polysilicon layer to form a gate electrode; and g) covering the surface of the gate electrode with a heat oxide film.

2. A method of manufacturing a field effect transistor according to claim 1, wherein said washing is performed using hydrofluoric acid.

3. A method of manufacturing a field effect transistor according to claim 1, wherein said heat treatment is conducted using nitrogen gas.

4. A method of manufacturing a field effect transistor according to claim 1, wherein said heat treatment is conducted at 700° C. or above.

5. A method of manufacturing a field effect transistor according to claim 1, wherein said titanium layer is sandwiched by a lower silicon layer and the upper silicon layer and is made the titanium silicide from both above and below said titanium layer by said heat treatment.

* * * * *

UNITED STATES PATENT AND TRADEMARK OFFICE
CERTIFICATE OF CORRECTION

PATENT NO. : 5,534,453
DATED : July 9, 1996
INVENTOR(S) : TETSUO ASABA

It is certified that error appears in the above-indentified patent and that said Letters Patent is hereby corrected as shown below:

ON THE TITLE PAGE

AT [56] References Cited

OTHER PUBLICATIONS, under "S.W. Kang": "TiSi2" should read --$TiSi_2$--.

COLUMN 1

Figure 4A:
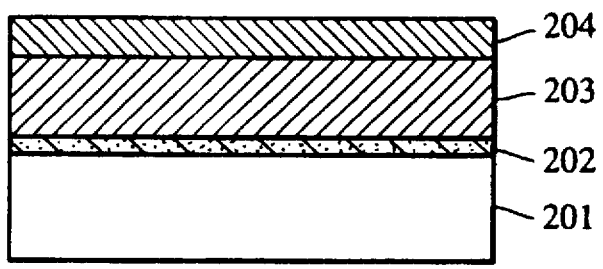
FIG. 4(a) and 4(b) illustrate a conventional method of forming a polycide.
Figure 4B:
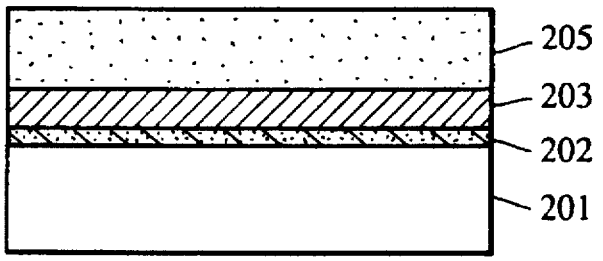

Line 40,  "FIG. 5" should read --FIG. 4--;
   Line 46,  "(FIG. 5(a))." should read --(FIG. 4(a)).--;
   Line 52,  "(FIG. 5(b))." should read --(FIG. 4(b)).--;
   Line 56,  "following" should read --the following--.

COLUMN 2

Line 50,  "the washing" should be deleted.

COLUMN 3

Line 26,  "The-method" should read --The method--;
   Line 48,  "FIG. 4." should read --FIG. 3.--;

UNITED STATES PATENT AND TRADEMARK OFFICE
CERTIFICATE OF CORRECTION

PATENT NO. : 5,534,453
DATED : July 9, 1996
INVENTOR(S) : TETSUO ASABA

It is certified that error appears in the above-indentified patent and that said Letters Patent is hereby corrected as shown below:

<u>COLUMN 3 continued</u>

Figure 3:
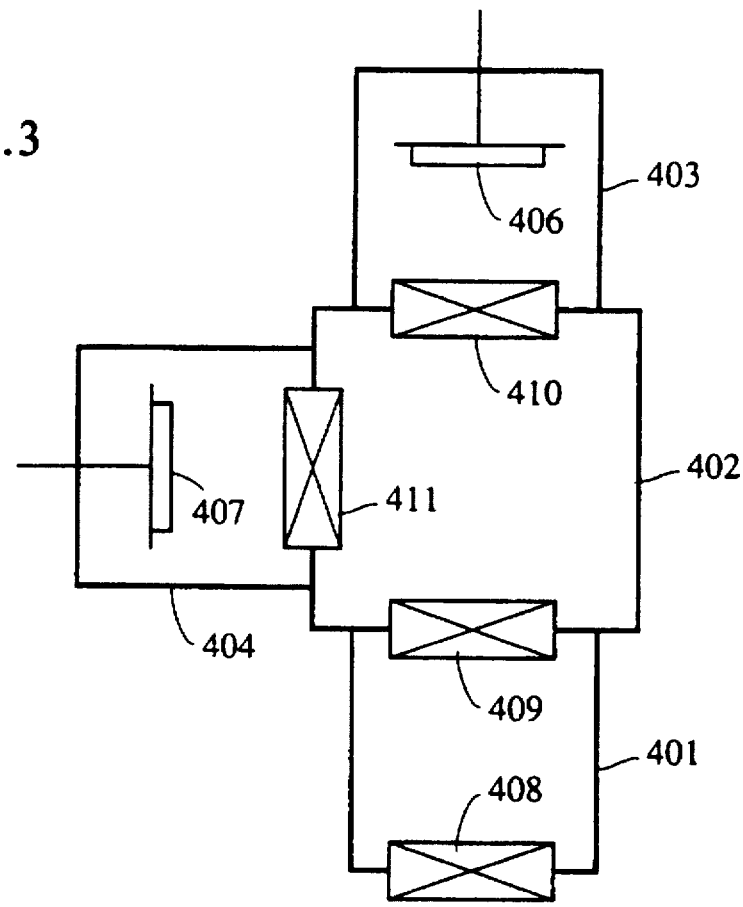
FIG. 3 is a schematic view illustrating an example of a sputtering device used to carry out the present invention.

Line 64,   "FIG. 4" should read --FIG. 3--.

<u>COLUMN 4</u>

Line 12,   "4" should read --3--;

Line 62,   "After all," should read --Afterwards,--.

Signed and Sealed this

Twenty-seventh Day of May, 1997

Attest:

BRUCE LEHMAN

*Attesting Officer*      *Commissioner of Patents and Trademarks*